United States Patent [19]
Choi

[11] Patent Number: 6,081,137
[45] Date of Patent: Jun. 27, 2000

[54] FREQUENCY DETECTING CIRCUIT

[75] Inventor: Sang-Shin Choi, Chungcheongbuk-do, Rep. of Korea

[73] Assignee: LG Semicon Co., Ltd., Cheongju, Rep. of Korea

[21] Appl. No.: 09/166,960

[22] Filed: Oct. 6, 1998

[30] Foreign Application Priority Data

Jan. 8, 1998 [KR] Rep. of Korea ............ 98-287

[51] Int. Cl.[7] .......................... G06F 9/305; H03D 13/00; H03L 7/09
[52] U.S. Cl. .............. 327/43; 327/49; 327/218; 327/47; 327/42
[58] Field of Search ................. 327/45, 47, 49, 327/218, 39

[56] References Cited

U.S. PATENT DOCUMENTS

| | | | |
|---|---|---|---|
| 5,533,136 | 7/1996 | Smith | 381/107 |
| 5,619,157 | 4/1997 | Kumata et al. | 327/218 |
| 5,926,042 | 7/1999 | Talaga, Jr. | 327/47 |

OTHER PUBLICATIONS

Pearson, "One Shot/Flip–Flop Pairs Detect Frequency Bands", Electronics, Apr. 24, 1972, p. 104.

Primary Examiner—Dinh T. Le
Attorney, Agent, or Firm—Fleshner & Kim, LLP

[57] ABSTRACT

A frequency detecting circuit is provided that includes a level shift detecting unit for generating pulse signals of a certain pulse width at each level shifting of input clock signals and a level detecting unit. The level detecting unit includes a charging unit and a discharging unit. The discharging unit is activated by the pulse signals of the level shift detecting unit to discharge the charges of the charging unit. An inverter having a logic threshold voltage receives electrical signals in accordance with the charged level of the charging unit to output a signal indicative of the frequency of the input clock signals.

18 Claims, 5 Drawing Sheets

FREQUENCY DETECTING CIRCUIT

BACKGROUND OF THE INVENTION

1. Field of the Invention

The present invention relates to a frequency detecting circuit, and in particular, to a frequency detecting circuit in which the frequency of signals is detected to output prescribed logic signals.

2. Background of the Related Art

A frequency detecting circuit compares the frequency of inputted signals with a reference frequency to express their magnitude relationship in electrical signals. The input signal and reference signal can be compared using various methods. That is, either the frequencies are directly compared, or the frequency of the input signals is converted into a voltage or current, which is compared with a reference voltage or a reference current. The frequency detection result can be expressed either in analog signals or in digital signals. The analog signals are expressed in a voltage or a current proportional to the detected frequency. The digital signals are expressed by converting the analog signals into the digital signals.

Figure 1:
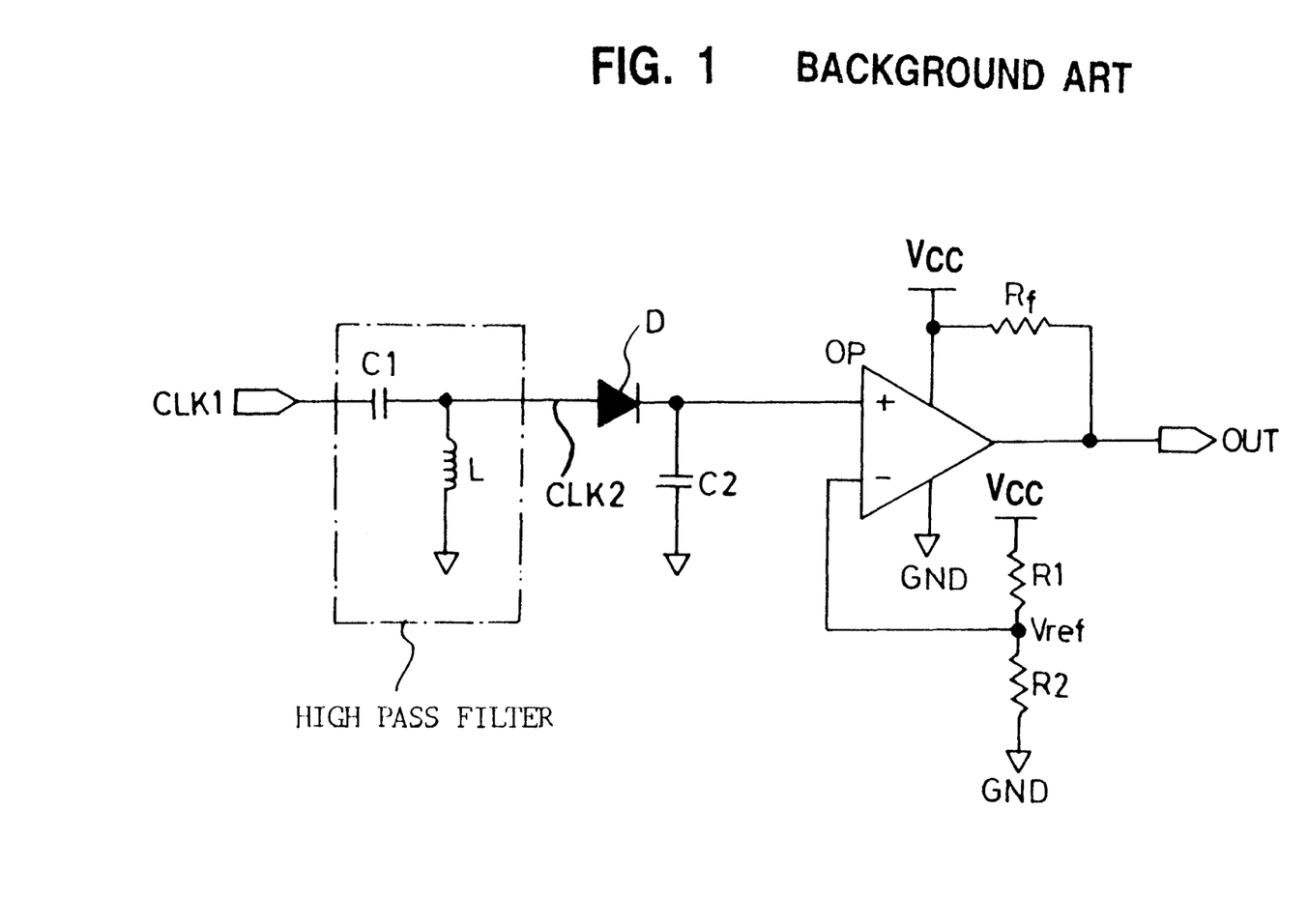
FIG. 1 is a circuit diagram showing a related art frequency detecting circuit.

FIG. 1 is a circuit diagram showing a related art frequency detecting circuit. As shown in FIG. 1, clock signals CLK1 to be measured are inputted into a high pass filter consisting of a capacitor C1 and an inductor L. Owing to the high pass filter of the input clock signals CLK1, only clock signals CLK2 higher than a certain frequency are output. The clock signals CLK that have passed through the high pass filter are converted into dc signals by a rectifying diode D to charge a capacitor C2. The dc level of the dc signals from the diode D is proportional to the frequency of the clock signals CLK2, which have passed through the high pass filter. Therefore, the voltage of the capacitor C2 reflects the frequency of the clock signals CLK2.

The voltage of the capacitor C2 is inputted into a non-inverting input terminal of an arithmetic amplifier OP having a feedback resistor $R_f$. An inverting terminal of the arithmetic amplifier OP receives a reference voltage $V_{ref}$, which is formed by two resistors R1 and R2. In accordance with the magnitude relation between the inputted dc signals and the reference voltage, the arithmetic amplifier OP outputs a positive voltage or a negative voltage. Thus, a measurement can be made whether the frequency of the clock signals CLK2 is higher than a frequency represented by the reference voltage.

As described above, the related art frequency detecting circuit has various disadvantages. The related art frequency detecting circuit includes a high pass filter requiring an inductor. It is difficult precisely control circuit characteristics when employing the inductor (e.g., the inductor L) in a fastidious semiconductor integrated circuit. Further, an inductor occupies a large area in the semiconductor integrated circuit, and therefore, the total layout of the frequency detecting circuit is increased. In addition, the related art frequency detecting circuit includes an arithmetic amplifier, which consists of a TTL logic, and therefore cannot be manufactured by the CMOS process. Accordingly, a cost of the circuit is increased.

The above references are incorporated by reference herein where appropriate for appropriate teachings of additional or alternative details, features and/or technical background.

SUMMARY OF THE INVENTION

An object of the present invention is to substantially overcome one or more of the problems caused by disadvantages of the related art frequency detecting technique.

Another object of the present invention to provide a frequency detecting circuit that uses a charging circuit and a discharging circuit manufactured by a standard CMOS process.

Another object of the present invention is to provide a frequency detector manufactured by a CMOS process.

Another object of the present invention is to provide a frequency detector that has a reduced size.

Another object of the present invention is to provide a frequency detector that has a discharging device controlled by clock signals to discharge the charged voltage proportionally to the frequency of clock signals, and detects whether the charged voltage is lowered to below a reference value to express the detected result in digital signals such as a binary logic value.

To accomplish at least the above objects in a whole or in part, a frequency detecting circuit according to the present invention is provided that includes a pulse generator that receives a clock signal having a variable frequency and generates pulse signals having a prescribed pulse width based on delay of the clock signal, and a level detecting circuit responsive to the pulse signals that outputs a signal indicative of the frequency of the clock signal based on a potential of an output node.

To further accomplish the above objects in a whole or in part, a frequency detector according to the present invention is provided that includes a pulse generating circuit that receives the clock signal and generates pulse signals, and a level detecting circuit having a charging circuit coupled to a node that increases a potential of the node, a discharging circuit responsive to the pulse signals to discharge the potential of the node, and a threshold detector coupled to the node to out put a detection signal indicative of a frequency of the clock signal.

To further accomplish the above objects in a whole or in part, a frequency detector according to the present invention is provided that includes a pulse generating circuit that generates pulse signals, a plurality of level detecting circuits that output a plurality of output signals, wherein each of the level detecting circuits has a threshold detector that outputs an output signal indicative of the frequency of the clock signal, a charging circuit coupled to the threshold detector at a node, wherein the charging circuit increases a potential of the node, and a discharging circuit responsive to the pulse signals to discharge the charges at the nodes wherein at least two of the plurality of level detecting circuits have differing thresholds, and an output circuit that receives the plurality of output signals to determine a digital signal based on the clock signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 2:
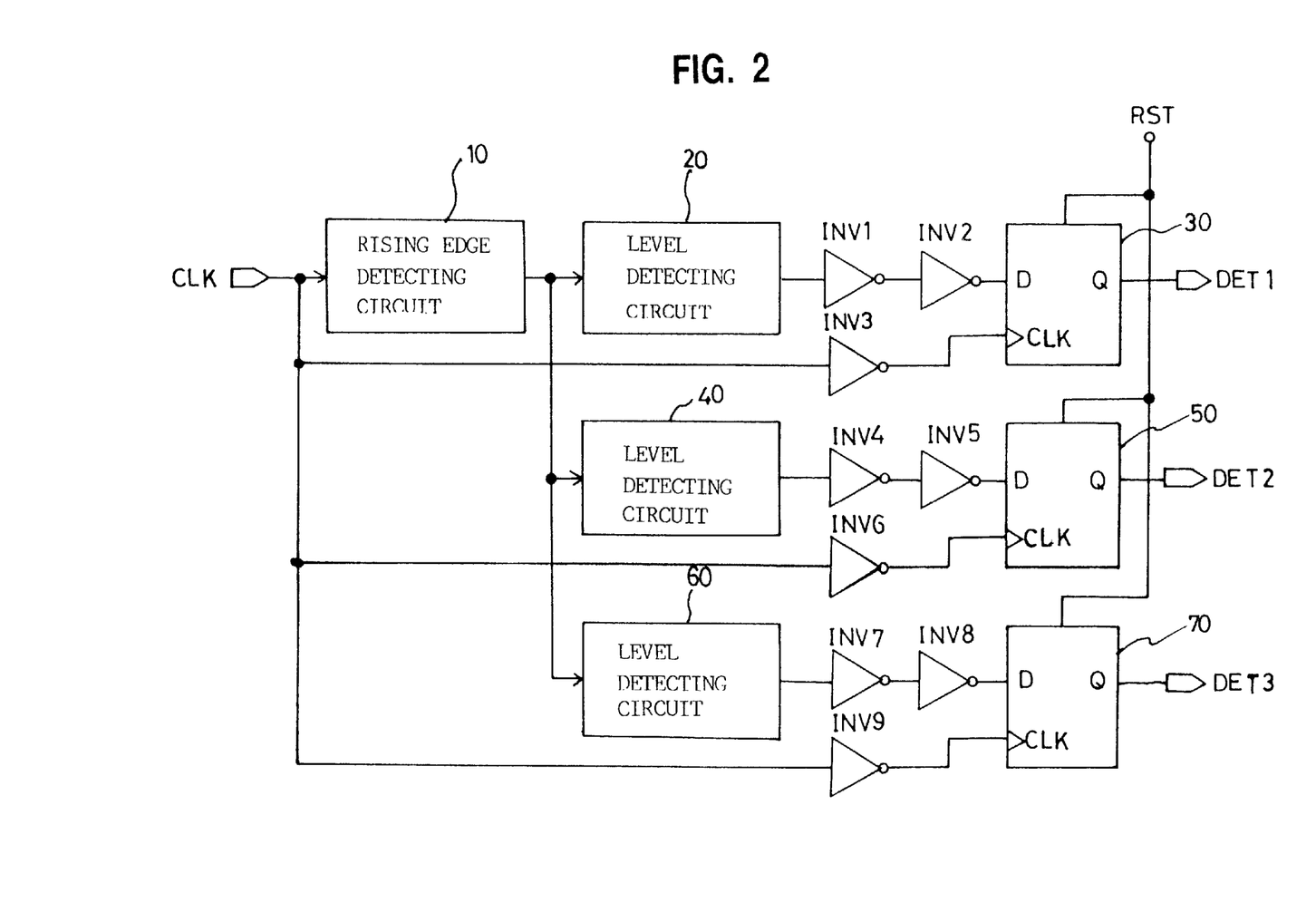
FIG. 2 is a block diagram showing a preferred embodiment of a frequency detecting circuit according to the present invention.

FIG. 2 is a block diagram illustrating a preferred embodiment of a frequency detecting circuit according to the present invention. As shown in FIG. 2, the preferred embodiment of the frequency detecting circuit preferably detects whether clock signals CLK are higher than a reference value to express a frequency detection result in binary logic signals. In the preferred embodiment of the frequency detecting circuit, a plurality of modules are coupled in parallel. Therefore, the frequency of the inputted clock signals CLK can be expressed in digital signals consisting of, for example, a plurality of binary bits. The preferred embodiment includes a rising edge detecting circuit 10, which is preferably a level shift detector, that generates pulse signals with the same frequency of the clock signals CLK. The pulse signals generated by the rising edge detecting circuit 10 are preferably relatively short, and the pulse signal is generated at each rising edge.

The preferred embodiment of the frequency detecting circuit further includes a level detecting circuit 20, which is preferably a level detector including a charging unit and a discharging unit. The charging unit can be charged all the time by a power source voltage. The discharging unit is activated by the pulse signals of the rising edge detecting circuit 10 to periodically discharge the charging unit. The level detecting circuit 20 also includes a circuit element having a prescribed logic threshold voltage. Thus, based on whether the charged level of the charging unit is higher or lower than the logic threshold voltage, there is generated a binary logic signal of 1 or 0.

If the frequency detecting circuit of the preferred embodiment of the frequency detecting circuit is provided with a plurality of modules capable of detecting the frequency, and if the level detecting circuit of each of the modules is made to have a different logic threshold voltage, then each module can generate different logic signals in accordance with a single frequency of the clock signals CLK.

The binary logic signals that are generated by the level detecting circuit 20 are preferably inputted through two serially connected inverters INV1 and INV2 into a data input terminal of a D flip flop 30. Clock signals that are inverted by an inverter INV3 are inputted into a clock signal input terminal of the D flip flop 30. The two serially coupled inverters INV1 and INV2 and the D flip flop 30 preferably convert the output signals of the level detecting circuit 20 into definite digital logic signals.

Thus, a module of the preferred embodiment preferably includes a level detecting circuit, three inverters and a flip flop that receives a clock signal and the output of the level detecting circuit via the inverters. A plurality of such modules (as shown in FIG. 2) can generate digital signals including a plurality of bits in accordance with the frequency detection results. For example, assume the logic threshold voltage of the level detecting circuit 20 is set to a lowest level, the logic threshold voltage of the level detecting circuit 40 is set to an intermediate level and the level detecting circuit 60 is set to a highest level. If the charged voltages of the charging unit of the level detecting circuit 20 is above a corresponding logic threshold voltage and the charged voltages of the charging units of the level detecting circuits 40 and 60 are lower than corresponding logic threshold voltages, then only the D flip flop 30 generates a logic signal of a logic value 1, while the other D flip flops 50 and 70 generate a logic signal of a logic value 0.

Figure 3:
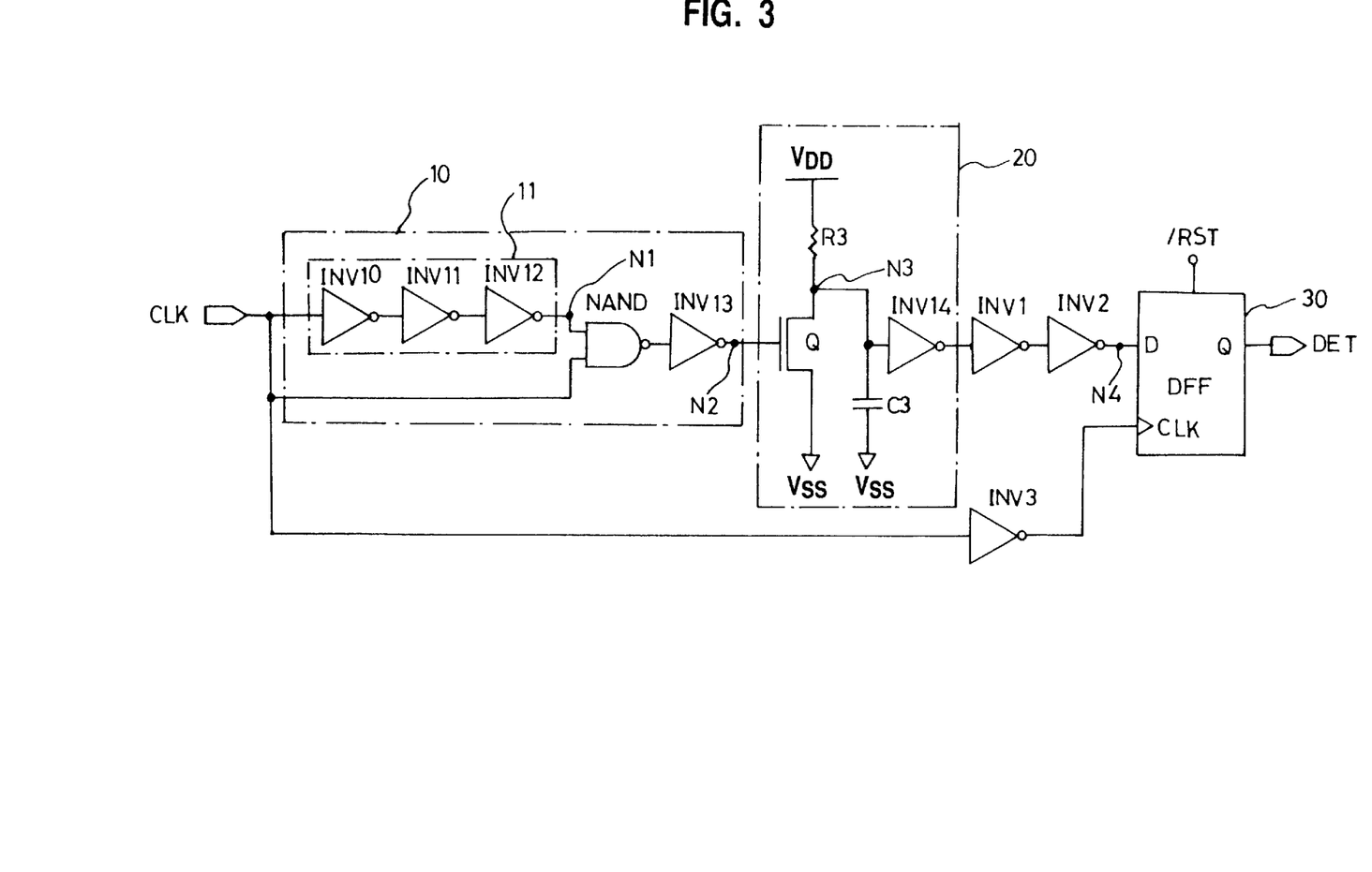
FIG. 3 is a circuit diagram showing an exemplary circuit for a portion of the frequency detecting circuit according to the present invention.

FIG. 3 is a circuit diagram showing one exemplary portion including a module of the preferred embodiment of the frequency detecting circuit according to the present invention. As shown in FIG. 3, the rising edge detecting circuit 10 includes a NAND gate NAND and an inverter INV13. The NAND gate NAND receives the clock signals CLK through both a delaying path and a direct path. The delaying path preferably includes three inverters INV10–INV12 serially coupled to achieve a time delay having a prescribed period. If the clock signals CLK are in a low level, the output signals of the inverter INV13 have a low level. In this state, if the clock signals CLK are shifted to a high level, then one of the inputs of the NAND gate NAND (i.e., the direct path) comes to have a high level. Further, another input that has passed through a delay unit 11 is still maintained in a high level. Therefore, the output of the inverter INV13 becomes high.

However, if a delay time of the delay unit 11 is elapsed, the input of the NAND gate received through the delaying path comes to have a low level. Therefore, the output of the inverter INV13 comes to have a low level. That is, the rising edge detecting circuit 10 generates pulse signals having a frequency equal to the clock signals CLK. At each rising edge, the pulse signals have a short high level interval proportion to the delay of the delay unit 11. Therefore, if the frequency of the clock signals CLK increases, the number of the high level intervals of the pulse signals is increased. The present invention is not intended to be limited to the described rising edge detecting circuit. Alternative implementations such as a falling edge detecting circuit can be used. The output pulse signals of the rising edge detecting circuit 10 are inputted into the level detecting circuit 20.

The level detecting circuit 20 includes a charging unit preferably including a resistor R3 and a capacitor C3 serially coupled between a power source voltage VDD and a ground voltage VSS and a discharging unit. An NMOS transistor Q operates as the discharging unit coupled in parallel with the resistor R3. The gate of the NMOS transistor Q is controlled by the pulse signals of the rising edge detecting circuit 10.

The capacitor C3 charges through the resistor R3 during the time when the NMOS transistor Q is turned off. The capacitor C3 is discharged during the time when the NMOS transistor Q is turned on.

Therefore, the charging degree of the capacitor C3 is inversely proportional to the on time of the NMOS transistor Q. The NMOS transistor Q is turned on or off by the pulse signals of the rising edge detecting circuit 10. Therefore, if the frequency of the pulse signals is increased, then the turn-on time of the NMOS transistor Q is increased. The increase in the turn-on time of the NMOS transistor Q causes an increase in the discharge amount of the capacitor C3. Accordingly, the voltage of a node N3 of the level detecting circuit 20 is lowered.

If the frequency of the clock signals CLK is decreased, then the frequency of the pulse signals is lowered. Therefore, the turn-on time of the NMOS transistor Q is decreased. If the turn-on time of the NMOS transistor Q is decreased, the discharge amount of the capacitor C3 is decreased.

Therefore, the voltage of the node N3 is increased. The inverter INV14, which receives the voltage from the node N3, has a prescribed logic threshold voltage. The prescribed logic threshold voltage is preferably set taking into account the value of the dc signals that have been obtained by converting the frequency through the frequency measuring circuit of FIG. 3.

If the frequency of the clock signals CLK is sufficiently low, the voltage of the node N3 becomes higher than the logic threshold voltage of the inverter INV14. Then, the inverter INV14 outputs a signal of a logic value 0.

If the frequency of the clock signals CLK is sufficiently high, the voltage of the node N3 becomes lower than the logic threshold voltage of the inverter INV14 . Then, the inverter INV14 outputs a signal of a logic value 1. The logic signal of the level detecting circuit (e.g., the level detecting circuit 20) is preferably transmitted through two serially coupled inverters (e.g., the inverters INV1 and INV2) into the flip flop (e.g., D flip flop 30). The D flip flop outputs at each falling edge of the clock signals CLK.

Figure 4:
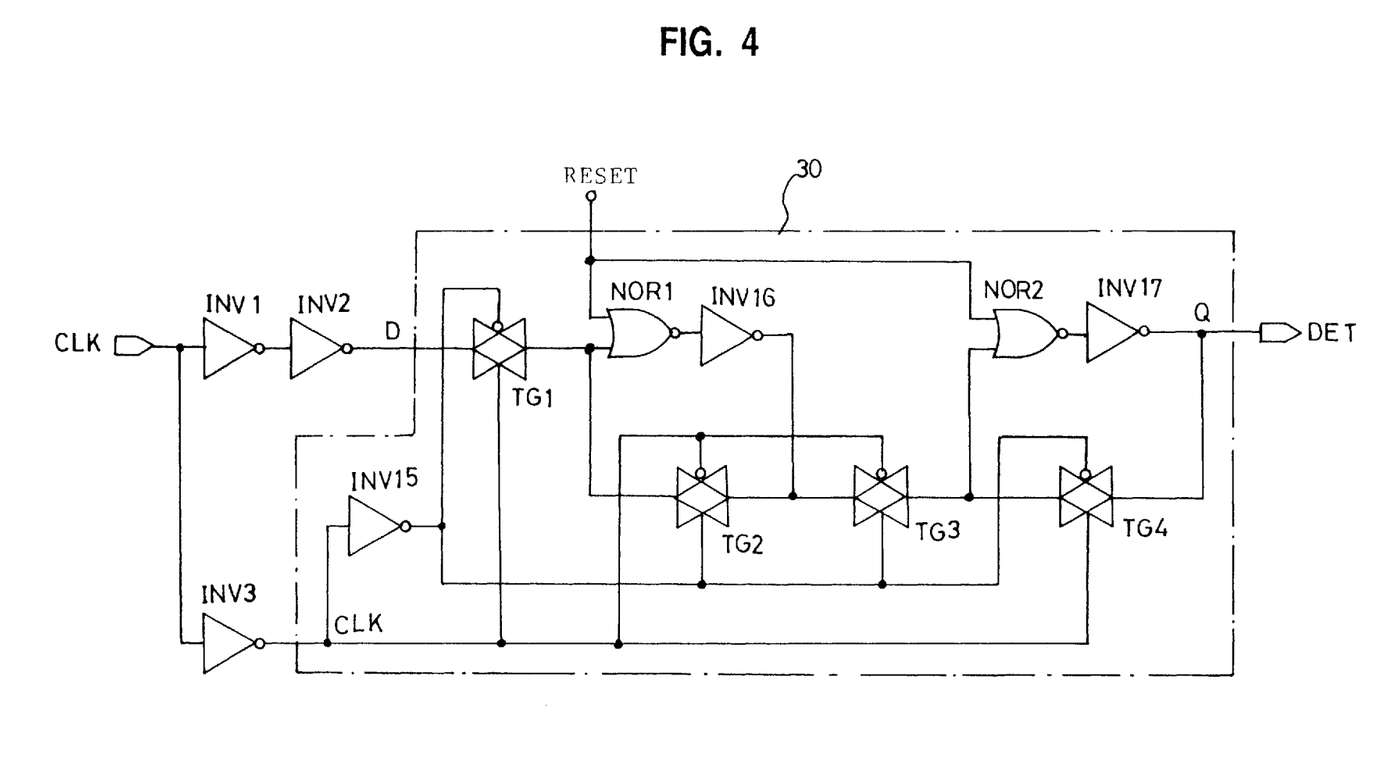
FIG. 4 is a circuit diagram showing an exemplary flip flop of the frequency detecting circuit of FIG. 3.

FIG. 4 is a circuit diagram showing an exemplary D flip flop 30 of the preferred embodiment of the frequency detecting circuit of FIG. 2. The D flip flop of FIG. 4 includes two latches. An input side latch includes two transmission gates TG1 and TG2, a NOR gate NOR1 and an inverter INV16. An output side latch includes transmission gates TG3 and TG4, a NOR gate NOR2 and an inverter INV17. The four transmission gates TG1–TG4 of the latches are turned on and off by signals having the same phase as that of the clock signals CLK and by signals having an inverted phase, which are formed by an inverter INV3 and an inverter INV15. The inverter INV3 is disposed outside the D flip flop 30, while the inverter INV15 is disposed inside the D flip flop 30.

The input side latch will now be described. A signal is outputted from the level detecting circuit (e.g. level detecting circuit 20, 40, 60) through two inverters (e.g., INV1 and INV2, INV4 and INV5, INV7 and INV8) into the transmission gate TG1 of the flip flop (e.g., D flip flops 30, 50, 70). The transmission gate TG1 is turned on when the clock signal is low. The output signal of the transmission gate TG1 is inputted into the NOR gate NOR1 together with a reset signal. The output signal of the NOR gate NOR1 is inverted by an inverter INV16, while the output signal of the inverter INV16 is fed back through the transmission gate TG2 into the NOR gate NOR1. The input terminal of the NOR gate NOR1 into which the output signal of the inverter INV16 is fed back also receives the output signal of the transmission gate TG1.

Unlike the transmission gate TG1, the transmission gate TG2 is turned on when the clock signal CLK is high. The output signal of the inverter INV16 is inputted through the transmission gate TG3 into the NOR gate NOR2 of the output side latch together with the reset signal. Like the transmission gate TG2, the transmission gate TG3 is turned on when the clock signal is high.

The output signal of the NOR gate NOR2 is inverted by an inverter INV17 and outputted as the output signal of the D flip flop 30, which is the frequency detecting signal DET. The frequency detecting signal DET is fed back through the transmission gate TG4 into the NOR gate NOR2. Under this condition, the input terminal of the NOR gate NOR2 into which the output signal of the inverter INV17 is feedback, also receives the output signal of the transmission gate TG3. Unlike the transmission gate TG3, the transmission gate TG4 is turned on when the clock signal is low. Thus, the transmission gates TG1 and TG4 are turned on when the clock signal is low, while the transmission gates TG2 and TG3 are turned on when the clock signal is high.

Operations of the exemplary D flip flop 30 will now be described. When the clock signal CLK is in a low level, the transmission gate TG1 is turned on, so that the output signal of the level detecting circuit is inputted into the NOR gate NOR1. Further, when the reset signal is a low level, the inverter INV16 outputs a signal having a level that is same as that of the signal inputted through the transmission gate TG1.

If the clock signal is then shifted to a high level, the transmission gate TG1 is turned off, while the two transmission gates TG2 and TG3 are turned on. Therefore, the output signal of the inverter INV16 feeds back into the NOR NOR1 to be latched there, while the same signal is also inputted through the transmission gate TG3 into the NOR gate NOR2. That is, the frequency detecting signal DET having a logic value same as that of the initial signal that has passed through the transmission gate TG1 is outputted.

If the clock signal CLK is shifted to a low level again, the two transmission gates TG1 and TG4 are turned on. Therefore, a new logic value signal is inputted into the NOR gate NOR1, while the frequency detecting signal DET feeds back through the turned-on transmission gate TG4 into the NOR NOR2 gate to be latched there.

Under this condition, the transmission gate TG3 is turned off. Thus, the output signal of the inverter INV16 of the input side latch cannot be supplied to the NOR gate NOR2 of the output side latch. Thus, the D flip flop 30 of FIG. 4 receives data at the falling edge of the clock signal CLK, while the data is outputted at the rising edge of the clock signal CLK.

Figure 5A:
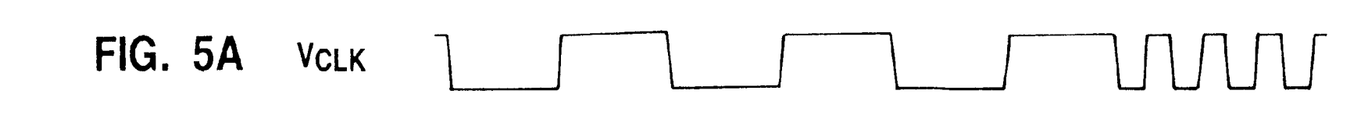
FIG. 5 is a diagram showing waveforms for signals of the frequency detecting circuit of FIG. 3 according to the present invention.
Figure 5B:
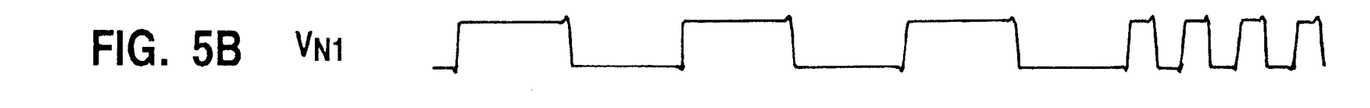

FIGS. 5A–5F are diagrams that illustrate wave patterns for the input and output signals of the preferred embodiment of the frequency detecting circuit. FIG. 5A illustrates the clock signal CLK, and FIG. 5B illustrates a voltage of the node N1 of FIG. 3.

Figure 5C:
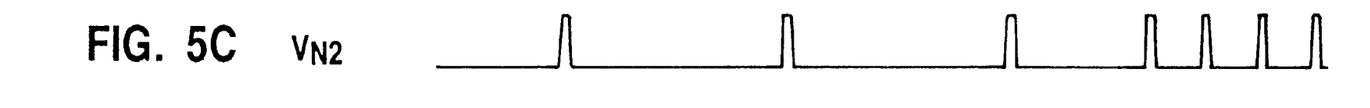

As shown in FIGS. 5A and 5B, a small time delay is produced between two signals inputted into the NAND gate NAND by the delay unit 11. The time delay makes a voltage level of the node N2 as shown in FIG. 5C. The voltage level at the node N2 is the output signal of the rising edge detecting circuit 10 of FIG. 3. As shown in FIG. 5C, the output signal of the rising edge detecting circuit 10 can have a very short high level segment because of the delay unit 11. Further, the output signal of the rising edge detecting curcuit 10 has a frequency equal to the clock signal CLK.

Figures 5D, 5E:
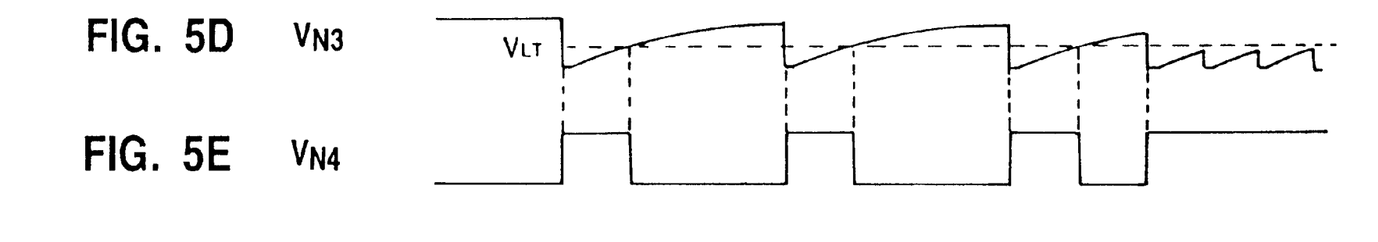

FIG. 5D is a diagram showing a wave pattern of the variation of the charged voltage charged into the capacitor C3 of the level detecting circuit 20 of FIG. 3. In FIG. 5D, if the frequency of the clock signal CLK is relatively low, the capacitor C3 is sufficiently charged. However, if the frequency of the clock signal CLK becomes high, the charging is only slightly larger than the discharging, and therefore, the voltage of the node N3 is lowered. The voltage level of node 3 plays an important role in setting the logic value of the frequency detecting signal DET in the D flip flop 30.

Figure 5F:
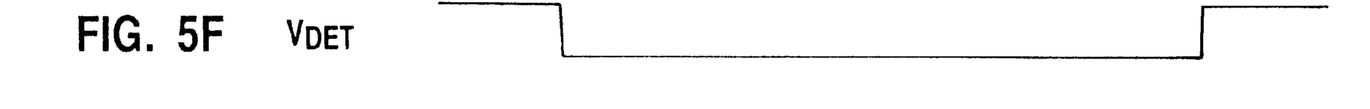

In the wave patterns shown in FIGS. 5D and 5E, the relatively low portions of the clock signals CLK generate a high voltage of the node N4 only in a segment where the voltage of the node N3 is lower than the logic threshold voltage VLT of the inverter INV14. However, when the voltage of the node N4 is high, the clock signal CLK is also high. Thus, the signal of the node N4 cannot be inputted into the D flip flop 30. Therefore, the D flip flop 30 outputs low level signals for VDET as shown in FIG. 5F because of the reset signal.

In the portion showing a relatively high frequency of the clock signal CLK, the maximum value of the charged voltage of the capacitor C3 is lowered below the logic threshold voltage VLT. Therefore, the voltage of the node N4 is maintained at a high level without any low level segment. Accordingly, the D flip flop 30 receives the high level signal of the node N4 in the low level segment of the clock signal CLK, and the signal previously inputted in the high level segment of the clock signal CLK is outputted. Consequently, the frequency detecting signal DET, which is the output signal of the D flip flop 30, becomes high. Thus, high level frequency detecting signal DET outputted from the D flip flop 30 indicates the frequency of the clock signal CLK is higher than a reference level.

As described above, the preferred embodiment of the frequency detecting circuit has various advantages. According to the preferred embodiment, a level shift detecting circuit is formed as a rising edge detecting circuit, and a CMOS process can be applied instead of using the high pass filter including an inductor. Further, when a frequency of the clock signal is higher than a reference value, the preferred embodiment of the frequency detecting circuit can express such results as digital signals using a binary logic value.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A frequency detecting circuit, comprising:
   a pulse generator that receives a clock signal having a variable frequency and generates pulse signals having a prescribed pulse width; and
   a level detecting circuit responsive to the pulse signals that outputs an output signal indicative of the frequency of the clock signal, wherein the output signal of the level detecting circuit is outputted through a D flip flop, and wherein said D flip flop comprises,
      a first transmission gate controlled by the clock signal that receives the output signal of said level detecting circuit,
      a first logic-gate having a first input terminal that receives output signals of said first transmission gate and a second input terminal that receives a reset signal,
      a second transmission gate coupled between an output terminal of said first logic-gate and said first input terminal of said first logic-gate,
      a third transmission gate coupled to the output of the second transmission gate,
      a second logic-gate having a first input terminal for receiving output signals of said second transmission gate through the third transmission gate and a second input terminal that receives the reset signal, and
      a fourth transmission gate coupled between an output terminal of said second logic gate and said first input terminal of said second logic gate.

2. The frequency detecting circuit of claim 1, wherein the level detecting circuit comprises:
   a charging circuit;
   a discharging circuit responsive to the pulse signals that discharges the charging circuit; and
   a logic-circuit having a prescribed threshold voltage and coupled to the charging circuit, wherein the logic circuit outputs the output signal based on a charged level of the charging circuit.

3. The frequency detector of claim 2, wherein the logic circuit outputs the output signal based on the charged level of the charging circuit relative to the prescribed threshold voltage.

4. The frequency detecting circuit of claim 1, wherein said pulse generator is a rising edge detecting circuit comprising:
   a delay circuit that receives the clock signal; and
   a first logic-gate that receives the clock signal directly and through the delay circuit to output the pulse signals.

5. The frequency detecting circuit of claim 4, wherein said delay circuit includes an inverting circuit that produces a time delay, and wherein the first logic-gate is an AND-gate.

6. The frequency detecting circuit of claim 1, wherein the level detecting circuit comprises:
   a resistor;
   a capacitor coupled in series to the resistor between first and second prescribed voltage levels, wherein a charging circuit comprises the resistor and the capacitor;
   a transistor having a control electrode that receives said pulse signals, a first electrode of the transistor coupled to a node between said resistor and said capacitor and a second electrode of the transistor coupled to the second prescribed voltage level; and
   an inverter having a prescribed threshold voltage coupled by an input terminal to the node coupling the resistor and the capacitor, wherein a discharging circuit comprises the transistor and the inverter.

7. The frequency detecting circuit of claim 1, wherein said D flip flop is synchronized to invert the clock signal while receiving the output signal and outputting the frequency detecting signal.

8. The frequency detecting circuit of claim 1, wherein the first and fourth transmission gates operate when the second and third transmission gates are disabled, and wherein the second and third transmission gates operate when the first and fourth transmission gates are disabled.

9. The frequency detecting circuit of claim 8, wherein said first and fourth transmission gates are turned on at a low level of said clock signal,wherein said second and third transmission gates are turned on at a high level of said clock signal, and wherein the first and second logic-gates are OR-gates.

10. The frequency detecting circuit of claim 1, further comprising a plurality of additional level detecting circuits coupled in parallel to receive the pulse signals of said pulse generator, wherein each of the plurality of additional level detecting circuits has a different prescribed threshold voltage, and wherein the level detecting circuit and each of the plurality of additional level detecting circuits together output a multi-bit digital signal based on the frequency of the clock signal.

11. The frequency detecting circuit of claim 10, wherein the multi-bit digital signals are proportional to the frequency of the clock signal.

12. A frequency detecting circuit responsive to a clock signal, comprising:
   a pulse generating circuit that receives the clock signal and generates pulse signals; and
   a plurality of level detecting circuits, each comprising,
      a charging circuit coupled to a node that increases a potential of the node,
      a discharging circuit responsive to the pulse signals to discharge the potential of the node, and a threshold detector coupled to the node to output an output signal indicative of a frequency of the clock signal, wherein the output signal of the level detecting circuit is outputted through a D flip flop, and wherein said D flip flop comprises,
   a first transmission gate controlled by the clock signal that receives the output signal of each of said level detecting circuits,
   a first logic-gate having a first input terminal that receives output signals of said first transmission gate and a second input terminal that receives a reset signal,
   a second transmission gate coupled between an output terminal of said first logic-gate and said first input terminal of said first logic-gate,
   a third transmission gate coupled to the output of the second transmission gate,
   a second logic-gate having a first input terminal for receiving output signals of said second transmission gate through the third transmission gate and a second input terminal that receives the reset signal, and
   a fourth transmission gate coupled between an output terminal of said second logic gate and said first input terminal of said second logic gate.

13. The frequency detecting circuit of claim 12, wherein an output of the D flip flop indicates whether the clock signal frequency is above a prescribed threshold frequency.

14. The frequency detecting circuit of claim 13, wherein the D flip flop outputs a first signal when the frequency of the clock signal is greater than the prescribed threshold frequency and outputs a second signal otherwise.

15. The frequency detecting circuit of claim 12, wherein each of the level detecting circuits comprises:
   a resistor;
   a capacitor coupled in series to the resistor between first and second prescribed voltage levels, wherein the charging circuit comprises the resistor and the capacitor;
   a transistor having a control electrode that receives said pulse signals, a first electrode of the transistor coupled to the node between said resistor and said capacitor and a second electrode of the transistor coupled to the second prescribed voltage level; and
   an inverter having a prescribed threshold voltage coupled by an input terminal to the node coupling the resistor and the capacitor, wherein the discharging circuit comprises the transistor and the inverter.

16. A frequency detector responsive to a clock signal, comprising:
   a pulse generating means for generating pulse signals;
   a plurality of level detecting means for outputting a plurality of output signals, wherein each of the level detecting means comprises,
      a threshold detecting means for outputting an output signal indicative of the frequency of the clock signal,
      a charging means coupled to the threshold detecting means at a node, for increasing a potential of the node, and
      a discharging means responsive to the pulse signals for discharging the charges at the node, wherein at least two of the plurality of level detecting means have differing thresholds; and
   an outputting means for receiving the plurality of output signals and outputting a digital signal based on the clock signal, wherein the output signal of said each of the level detecting means is outputted through a corresponding flip-flop means of a plurality of flip-flop means for logically combining the output signal and the clock signal, wherein each of said flip-flop means comprises,
      a first transmission means controlled by the clock signal for receiving and transmitting the output signal of said corresponding level detecting means,
      a first logic means having a first input terminal for receiving an output signal of said first transmission means and a second input terminal for receiving a reset signal,
      a second transmission means coupled for receiving an output of said first logic means and transmitting a signal to said first input terminal of said first logic means,
      a third transmission means coupled for receiving the output of the second transmission means,
      a second logic means having a first input terminal for receiving an output signal of said second transmission means through the third transmission means and a second input terminal for receiving the reset signal, and
      a fourth transmission means coupled for receiving an output of said second logic means and transmitting a signal to said first input terminal of said second logic means, wherein the first and fourth transmission means operate when the second and third transmission means are disabled, and wherein the second and third transmission means operate when the first and fourth transmission means are disabled.

17. The frequency detector of claim 16, wherein said each of the level detecting means further comprises:
   a resistor;
   a capacitor coupled in series to the resistor between first and second prescribed voltage levels, wherein the charging means comprises the resistor and the capacitor;
   a transistor having a control electrode that receives said pulse signals, a first electrode of the transistor coupled to the node between said resistor and said capacitor and a second electrode of the transistor coupled to the second prescribed voltage level; and
   an inverter having a prescribed threshold coupled by an input terminal to the node coupling the resistor and the capacitor, wherein the discharging means comprises the transistor and the inverter.

18. The frequency detector of claim 17, wherein the outputting means comprises a plurality of output units that each comprise one of the plurality of flip-flop means for outputting a signal representative of a comparison between the clock signal frequency and the threshold.

* * * * *